US005299099A

United States Patent [19]

Archambault

[11] Patent Number: 5,299,099

[45] Date of Patent: Mar. 29, 1994

[54] SAFETY RETAINER FOR AN ELECTRICAL RECEPTACLE

[76] Inventor: Larry J. Archambault, 11 Prospect Pl., Hillsdale, N.J. 07642

[21] Appl. No.: 998,417

[22] Filed: Dec. 30, 1992

[51] Int. Cl.$^5$ ............................................ H05K 7/00

[52] U.S. Cl. .................................... 361/837; 361/600; 361/627; 361/728; 361/807; 174/51; 200/51 R; 220/243; 248/51; 439/144

[58] Field of Search ............... 361/380, 331, 334, 356, 361/357, 392, 417, 8, 600, 622, 627, 628, 728, 807, 837; 174/66, 67, 51; 439/144, 145, 373, 471; 248/51, 302-304; 220/24.1, 24.3; 200/51 R

[56] References Cited

U.S. PATENT DOCUMENTS 2,219,931 10/1940 Matheny .
2,515,257 7/1950 O'Brien .
2,644,853 7/1953 Berninger et al. .
2,943,138 6/1960 Reager .
3,163,481 12/1964 Salvador .
3,331,915 7/1967 Lucci .
3,838,383 9/1974 Wilbur et al. .
3,930,116 12/1975 Richards .
4,335,863 6/1982 Rapps .
4,340,772 7/1982 Bose .
4,403,708 9/1983 Smolik ................................ 220/3.5
4,566,666 1/1986 Meska et al. .
4,702,709 10/1987 Santilli .
4,810,833 3/1989 Meyers ................................ 174/67
4,857,004 8/1989 Poirier ................................ 439/140
4,899,019 2/1990 Riceman ................................ 174/67
4,915,638 4/1990 Domian ................................ 439/142
4,952,755 8/1990 Engel et al. ................................ 174/67
5,087,796 2/1992 Norman ................................ 174/67
5,114,365 5/1992 Thompson et al. ................................ 439/540

*Primary Examiner*—Leo P. Picard
*Assistant Examiner*—Young Whang
*Attorney, Agent, or Firm*—Samuelson & Jacob

[57] ABSTRACT

A safety retainer for retaining an electrical device connected to an electrical receptacle against inadvertent disconnection includes a cover plate having opposed raised bars secured to the cover plate adjacent the electrical connector of the receptacle and a retainer strap looped beneath the raised bars and across the electrical device to secure the electrical device in place when connected to the receptacle, the cover plate being unbroken between the electrical connector and the peripheral edge of the cover plate so as to provide a completely integrated cover plate over the receptacle.

10 Claims, 2 Drawing Sheets

SAFETY RETAINER FOR AN ELECTRICAL RECEPTACLE

BACKGROUND OF THE INVENTION

1. Field of the Invention

The present invention relates generally to safety retainers for electrical devices and pertains, more specifically, to a safety retainer for retaining an electrical device connected to an electrical receptacle against inadvertent disconnection from the electrical receptacle.

2. Description of the Prior Art

Conventional electrical receptacles usually include at least one, and usually more than one, electrical connector having a connector element with sockets for receiving complementary pins projecting from an electrical plug on the electrical device to be connected to the receptacle. A cover plate covers the receptacle and includes apertures through which the connector elements are accessed for connection to the electrical device. It has become accepted widely, in the installation of various low-voltage systems, such as intruder alarm systems, smoke and fire alarm systems, communications systems, and the like, to connect a small transformer directly to an available receptacle, usually found in a wall, and rely upon the electrical connection between the pins and the sockets to maintain the mechanical as well as the electrical connection between the transformer and the receptacle.

In many installations, a supplemental mechanical connection, often coupled to an existing screw which holds the cover plate in place, is employed to secure the transformer in place against inadvertent disconnection. Local building codes generally require that the integrity of the cover plate be maintained; hence, these supplemental mechanical connections should not disturb the integrity of the cover plate. While a wide variety of retention devices are available for securing electrical connectors and electrical devices in place when connected at an electrical receptacle, these available devices often are cumbersome, require somewhat complex installation procedures, and do not permit ready removal, should such removal become necessary for maintenance purposes. Those retention devices which are more simple in construction and use often do not maintain adequate and reliable securement.

SUMMARY OF THE INVENTION

The present invention provides a relatively simple yet effective retainer for safely securing an electrical device, such as a transformer, connected to a conventional available electrical receptacle, without compromising the integrity of the cover plate of the receptacle. As such, the present invention attains several objects and advantages, some of which are summarized as follows: Provides a simple, yet highly effective safety retainer for securing a transformer, or a similar electrical device, in place, connected at an electrical receptacle, against inadvertent disconnection, while enabling ready selected disconnection and removal of the electrical device; enables ready compatibility with existing available electrical receptacles by the mere replacement of the existing cover plate with a cover plate constructed in accordance with the invention; can be employed easily in a wide variety of installations utilizing any one of a number of electrical devices which is to be secured in connection with an electrical receptacle; requires no special tools or techniques for use in the various installations; maintains the integrity required in electrical receptacles while providing ease of securing and releasing an electrical device connected to the electrical receptacle; provides exceptional reliability when employed with existing electrical receptacles for widespread acceptance and use; enables economical manufacture in large numbers of uniform high quality for exemplary performance over a long service life.

The above objects and advantages, as well as further objects and advantages, are attained by the present invention, which may be described briefly as an improvement in a safety retainer for retaining an electrical device connected to an electrical receptacle against inadvertent disconnection, the receptacle being of the type having a connector element to be associated with a cover plate, the safety retainer having a retainer strap for juxtaposition with the connector element to straddle the electrical device connected to the connector element to retain the electrical device connected to the connector element, the improvement comprising: a cover plate for association with the connector element in the receptacle, the cover plate having a peripheral edge, an outer surface, an inner surface and at least one aperture extending between the outer surface and the inner surface, through which aperture the connector element is accessed when the cover plate is associated with the connector element; and a pair of hold-down retainers integral with the outer surface of the cover plate and located at opposed locations between the aperture and a corresponding portion of the peripheral edge of the cover plate, the hold-down retainers being spaced from the outer surface and the outer surface being unbroken between the aperture and the peripheral edge such that the cover plate is integrated for covering the receptacle and the retainer strap may be secured to the hold-down retainers.

BRIEF DESCRIPTION OF THE DRAWING

The present invention will be understood more fully, while still further objects and advantages will become apparent, in the following detailed description of a preferred embodiment of the invention illustrated in the accompanying drawing, in which.

DESCRIPTION OF THE PREFERRED EMBODIMENT

Figure 1:
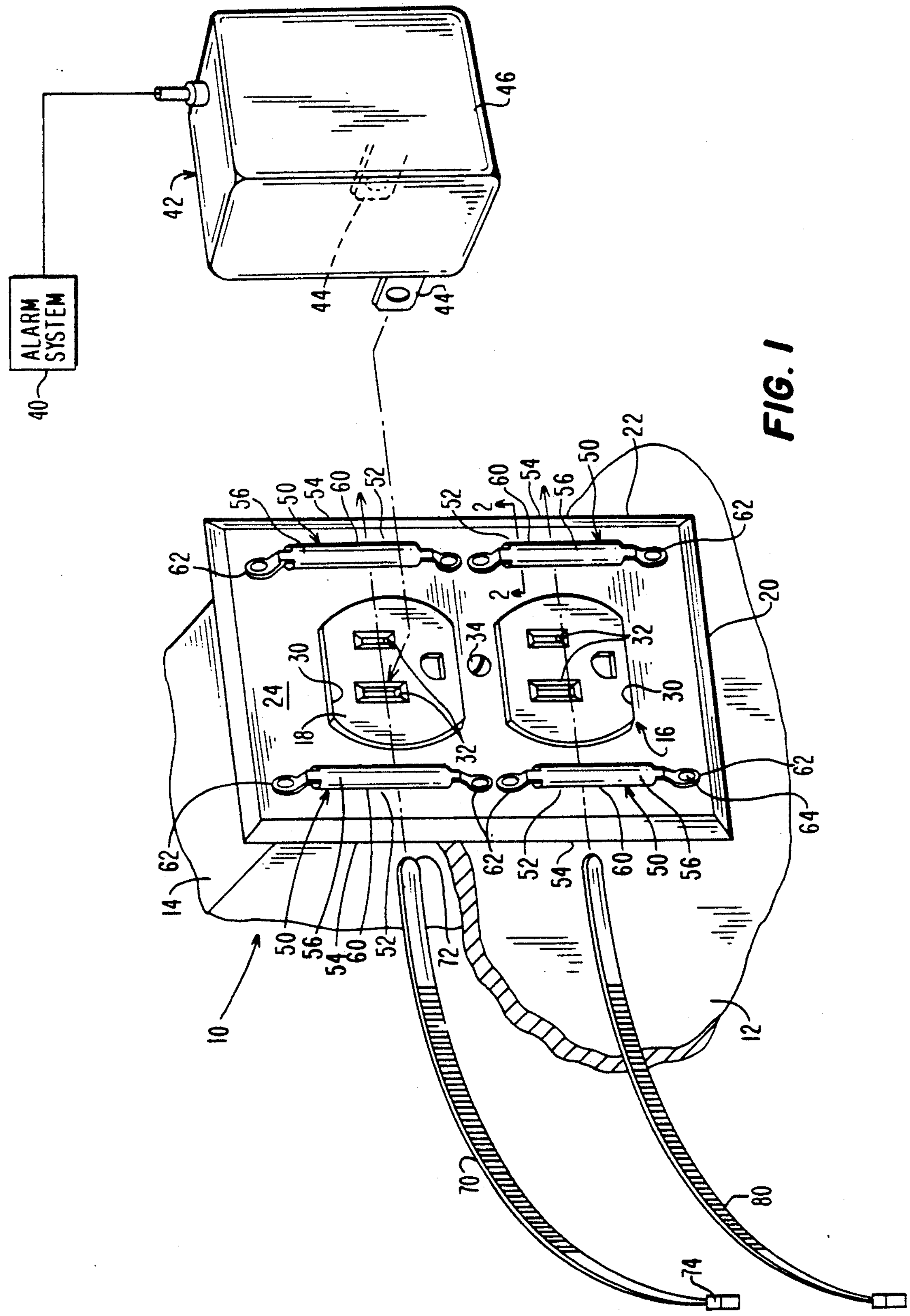
FIG. 1 is an exploded pictorial, partially diagrammatic view showing a safety retainer constructed in accordance with the present invention.
Figure 2:
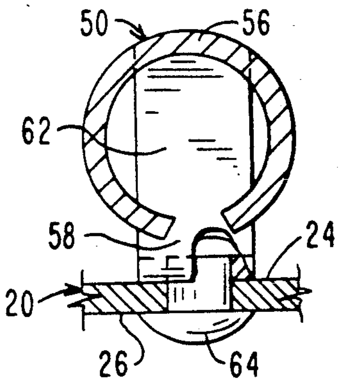
FIG. 2 is an enlarged cross-sectional view taken along line 2—2 of FIG. 1.

Referring now to the drawing, and especially to FIGS. 1 and 2 thereof, a conventional electrical receptacle 10 is placed in a wall 12 and is seen to include a box 14 affixed within the wall 12, and an electrical connector 16 secured in the box 14 and having two electrical connector elements 18. The conventional cover plate of receptacle 10 has been replaced by a cover plate 20 constructed in accordance with the present invention. Cover plate 20 has an outer peripheral edge 22 which follows the configuration of a conventional cover plate and defines an outer surface 24 and an opposite inner surface 26. A pair of apertures 30 extend through the cover plate 20, from the outer surface 24 to the inner surface 26, and are complementary to the corresponding connector elements 18 to enable access to the connector elements 18, and to sockets 32 provided in each connector element 18, in a now well-known manner. Cover plate 20 is fastened to electrical connector 16 and held in place against wall 12 by means of a threaded fastener 34.

An alarm system 40 is to be connected electrically to receptacle 10 and includes an electrical device in the form of a transformer 42 through which the actual connection is to be made. Transformer 42 has a pair of electrical contacts in the form of pins 44 which project from the body 46 of the transformer 42 and are complementary to the sockets 32 of the electrical connector element 18 to which the transformer 42 is to be connected. Upon connection of the transformer 42 to the receptacle 10, the pins 44 of the transformer 42 are inserted into corresponding sockets 32 to complete an electrical connection, while at the same time providing a mechanical connection between the transformer 42 and the receptacle 10.

In order to secure the transformer 42 against inadvertent disconnection from the receptacle 10, cover plate 20 is provided with a safety retainer which includes a pair of hold-down retainers 50 integral with the outer surface 24 of the cover plate 20 and located at opposed locations 52 between the respective aperture 30 and corresponding portions 54 of the outer peripheral edge 22 of the cover plate 20. Each hold-down retainer 50 includes a bar 56 extending longitudinally essentially parallel to corresponding portion 54 of the peripheral edge 22 and raised from outer surface 24 so as to be spaced from the outer surface 24 of the cover plate 20 by a relatively short distance 58. In the preferred construction shown in connection with the illustrated embodiment, each bar 56 has a generally tubular portion 60 and ears 62 formed unitary with the tubular portion 60 and extending axially from the tubular portion 60 and toward the outer surface 24 to space the tubular portion 60 from the outer surface 24. Each ear 62 is secured permanently to the cover plate 20, as by a fastener element shown in the form of a rivet 64. In this manner, the integrity of the cover plate 20 is maintained; that is, there are no openings through the cover plate 20 to the interior of the box 14, other than apertures 30 for connector elements 18. Hence, the construction of cover plate 20 meets the requirements of local building codes wherein the cover plate 20 must provide a complete integrated and unbroken cover over the box 14.

Figure 3:
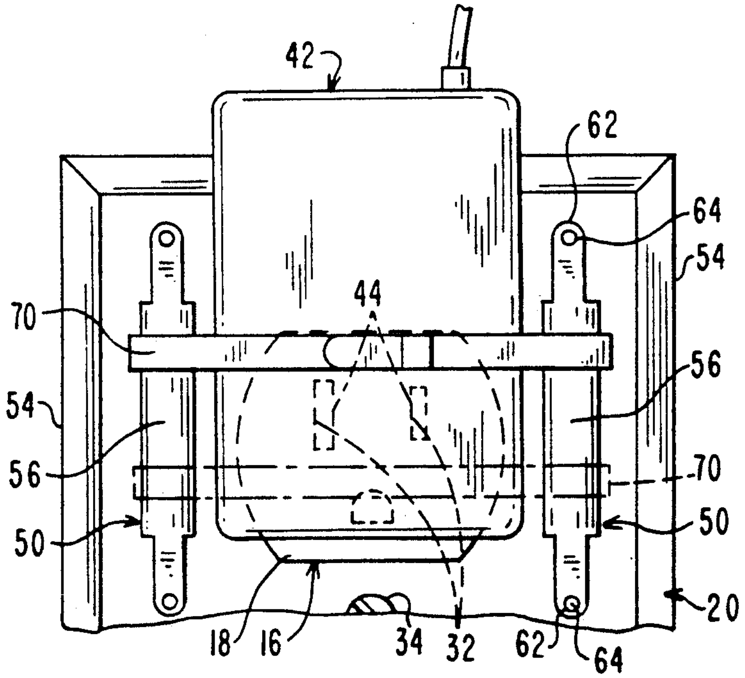
FIG. 3 is a fragmentary front elevational view illustrating the safety retainer in use.

Turning now to FIG. 3, as well as to FIG. 1, a retainer strap in the form of a conventional wire tie 70 is threaded through the space between the outer surface 24 of the cover plate 20 and the opposed bars 56 associated with the electrical connector element 18 to which the transformer 42 is to be connected. Once the transformer 42 is connected to the electrical connector element 18, as seen in FIG. 3, by insertion of pins 44 into the sockets 32 of the corresponding electrical connector element 18, the juxtaposed wire tie 70, which is looped through the space between the bars 56 and the outer surface 24 of the cover plate 20, is routed over and across the transformer 42 to straddle the transformer 42 and is tightened to secure the transformer 42 in place. Thus, the tip 72 (see FIG. 1) of the wire tie 70 is threaded through the head 74 of the wire tie 70 and the wire tie 70 is pulled tight, in a well-known manner.

The longitudinal extent and the placement of the bars 56 is such that the lateral alignment of the wire tie 70 with respect to the transformer 42, and especially with respect to the pins 44 of the transformer 42, provides a stable mechanical connection, as well as an effective electrical connection, between the transformer 42 and the receptacle 10. Since different electrical devices may have different dimensions and shapes, each bar 56 has a longitudinal extent sufficient to accommodate a range of longitudinal dimensions and different configurations found in the electrical devices to be connected to receptacle 10. More specifically, the length of the bars 56 is such that the wire tie 70 can be routed across the transformer 42 along a lateral path which extends either above the sockets 32 of the connector element 18, as shown in full lines in FIG. 3, or below the sockets 32, as illustrated in phantom. Further, the length of wire tie 70 is such that a range of corresponding dimensions in these electrical devices is accommodated. If desired, a second electrical device (not shown), can be connected to the second electrical connector element 18 of electrical connector 16, utilizing a second wire tie 80 (see FIG. 1), and the corresponding hold-down retainers 50. When it is desired to disconnect transformer 42 from receptacle 10, wire tie 70 merely is cut and discarded. The ready availability of wire ties 70 enables easy and economical use of the cover plate 20 by workers involved with the installation of a wide variety of systems. All that such a worker need do is replace a conventional cover plate in the field with cover plate 20, utilizing conventional tools and techniques, and then employ an available wire tie 70 to secure the transformer 42, or another electrical device, in place. The ready availability of wire ties 70 renders the wire tie 70 expendable and economical to use. However, other retainer straps are available. For example, straps employing a VELCRO fastener can serve the purpose well.

It will be seen that the present invention attains the several objects and advantages summarized above; namely, provides a simple, yet highly effective safety retainer for securing a transformer, or a similar electrical device, in place, connected at an electrical receptacle, against inadvertent disconnection, while enabling ready selected disconnection and removal of the electrical device; enables ready compatibility with existing available electrical receptacles by the mere replacement of the existing cover plate with a cover plate constructed in accordance with the invention; can be employed easily in a wide variety of installations utilizing any one of a number of electrical devices which is to be secured in connection with an electrical receptacle; requires no special tools or techniques for use in the various installations; maintains the integrity required in electrical receptacles while providing ease of securing and releasing an electrical device connected to the electrical receptacle; provides exceptional reliability with existing electrical receptacles for widespread acceptance and use; enables economical manufacture in large numbers of uniform high quality for exemplary performance over a long service life.

It is to be understood that the above detailed description of a preferred embodiment of the invention is provided by way of example only. Various details of design and construction may be modified without departing from the true spirit and scope of the invention, as set forth in the appended claims.

The embodiments of the invention in which an exclusive property or privilege is claimed are defined as follows:

1. A safety retainer for retaining an electrical device connected to an electrical receptacle against inadvertent disconnection, the receptacle being of the type having a connector element juxtaposed with a cover plate, the safety retainer comprising:

a cover plate for juxtaposition with the connector element in the receptacle, the cover plate having a peripheral edge, an outer surface, an inner surface and at least one aperture extending between the outer surface and the inner surface, through which aperture the connector element is accessed when the cover plate is juxtaposed with the connector element;

a pair of hold-down retainers integral with the outer surface of the cover plate and located at opposed locations between the aperture and a corresponding portion of the peripheral edge of the cover plate, the hold-down retainers being spaced from the outer surface and the outer surface being unbroken between the aperture and the peripheral edge such that the cover plate is integrated for covering the receptacle; and a retainer strap for securement to the hold-down retainers with the retainer strap juxtaposed with the connector element and straddling the electrical device connected to the connector element to retain the electrical device connected to the connector element.

2. The safety retainer of claim 1 wherein at least one of the hold-down retainers includes a bar raised from the outer surface of the cover plate.

3. The safety retainer of claim 2 including a space between the raised bar and the outer surface and wherein the strap is looped through the space between the bar and the outer surface for passing across the connector element and the electrical device connected to the connector element.

4. The safety retainer of claim 1 wherein each of the hold-down retainers includes a bar raised from the outer surface of the cover plate.

5. The safety retainer of claim 4 including a space between each of the raised bars and the outer surface and wherein the strap is looped through the space between each of the bars and the outer surface for passing across the connector element and the electrical device connected to the connector element.

6. In a safety retainer for retaining an electrical device connected to an electrical receptacle against inadvertent disconnection, the receptacle being of the type having a connector element juxtaposed with a cover plate, the safety retainer having a retainer strap for juxtaposition with the connector element to straddle the electrical device connected to the connector element to retain the electrical device connected to the connector element, the improvement comprising:

a cover plate for juxtaposition with the connector element in the receptacle, the cover plate having a peripheral edge, an outer surface, an inner surface and at least one aperture extending between the outer surface and the inner surface, through which aperture the connector element is accessed when the cover plate is juxtaposed with the connector element; and a pair of hold-down retainers integral with the outer surface of the cover plate and located at opposed locations between the aperture and a corresponding portion of the peripheral edge of the cover plate, the hold-down retainers being spaced from the outer surface for enabling securement of the retainer strap to the hold-down retainers, and the outer surface being unbroken between the aperture and the peripheral edge such that the cover plate is integrated for covering the receptacle.

7. The safety retainer improvement of claim 6 wherein at least one of the hold-down retainers includes a bar raised from the outer surface of the cover plate.

8. The safety retainer improvement of claim 7 including a space between the raised bar and the outer surface of the cover plate, the space being such that the strap may be looped through the space and the outer surface for passing across the connector element and the electrical device connected to the connector element.

9. The safety retainer improvement of claim 6 wherein each of the hold-down retainers includes a bar raised from the outer surface of the cover plate.

10. The safety retainer improvement of claim 9 including a space between each raised bar and the outer surface of the cover plate, the space being such that the strap is looped through the space between each of the bars and the outer surface for passing across the connector element and the electrical device connected to the connector element.

* * * * *